(12) United States Patent
Kiso et al.

(10) Patent No.: US 6,204,443 B1
(45) Date of Patent: *Mar. 20, 2001

(54) SOLAR CELL MODULE HAVING A SPECIFIC FRONT SIDE COVERING MATERIAL AND A PROCESS FOR THE PRODUCTION OF SAID SOLAR CELL MODULE

(75) Inventors: Sigeo Kiso; Ichiro Kataoka; Satoru Yamada, all of Kyotanabe; Hidenori Shiotsuka, Nara, all of (JP)

(73) Assignee: Canon Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/093,350

(22) Filed: Jun. 9, 1998

(30) Foreign Application Priority Data

Jun. 9, 1997 (JP) ............................................. 9-150950

(51) Int. Cl.[7] ..................... H01L 31/0203; H01L 31/048; E04D 13/18
(52) U.S. Cl. ..................... 136/259; 136/239; 52/173.3; 126/621; 126/622; 126/623
(58) Field of Search .................... 136/251, 259, 136/249; 126/651, 654, 663, 670, 621, 622, 623; 359/655, 664, 665, 667, 726, 727; 52/173.3

(56) References Cited

U.S. PATENT DOCUMENTS

| 4,210,462 | * | 7/1980 | Tourneux | 136/89 |
| 4,499,658 | * | 2/1985 | Lewis | 29/588 |
| 4,636,578 | * | 1/1987 | Feinberg | 136/251 |
| 5,252,141 | * | 10/1993 | Inoue et al. | 136/251 |
| 5,344,498 | * | 9/1994 | Inoue | 136/251 |
| 5,582,653 | * | 12/1996 | Kataoka et al. | 136/251 |
| 5,589,006 | * | 12/1996 | Itoyama et al. | 136/248 |
| 5,597,422 | | 1/1997 | Kataoka et al. | 136/259 |
| 5,650,019 | * | 7/1997 | Yamada et al. | 136/251 |
| 5,660,645 | | 8/1997 | Mori et al. | 136/251 |
| 5,660,646 | * | 8/1997 | Kataoka et al. | 136/251 |
| 5,800,631 | * | 9/1998 | Yamada et al. | 136/251 |

* cited by examiner

Primary Examiner—Ellis Robinson
Assistant Examiner—Michael C. Miggins
(74) Attorney, Agent, or Firm—Fitzpatrick, Cella, Harper & Scinto

(57) ABSTRACT

A solar cell module comprising a photovoltaic element, and at least a surface side filler and a surface protective member which are disposed in this order on a light incident face of said photovoltaic element, wherein said surface side filler comprises a non-crosslinked organic polymer resin and a crosslinked organic polymer resin, said crosslinked organic polymer resin being provided on at least a surface of said non-crosslinked organic polymer resin. Said solar cell module excels particularly in weatherability and moisture resistance.

11 Claims, 5 Drawing Sheets

SOLAR CELL MODULE HAVING A SPECIFIC FRONT SIDE COVERING MATERIAL AND A PROCESS FOR THE PRODUCTION OF SAID SOLAR CELL MODULE

BACKGROUND OF THE INVENTION

1. Field of the Invention

The present invention relates to a highly reliable solar cell module. More particularly, the present invention relates to a highly reliable solar cell module comprising a photovoltaic element (a solar cell) as a photoelectric conversion member and a specific surface side covering material disposed to seal a front side (a light receiving face) of said photovoltaic element, which excels particularly in weatherability and moisture resistance and has good exterior appearance, and can be used as a building construction material such as a roofing material.

The present invention includes a process for the production of said solar cell module.

2. Related Background Art

There have been proposed a number of solar cell modules comprising a photovoltaic element (a solar cell) sealed by a resin, a surface protective member which covers a front side (a light receiving side) of said photovoltaic element, and a back side protective member which covers a back side of said photovoltaic element.

FIG. 5 is a schematic cross-sectional view illustrating the constitution of an example of such solar cell module.

In FIG. 5, reference numeral 501 indicates a transparent surface protective member, reference numeral 502 a transparent thermoplastic resin as a filler, reference numeral 503 a photovoltaic element (or a solar cell), reference numeral 504 an insulating back face protective member. In the solar cell module shown in FIG. 5, the photovoltaic element 503 is enclosed by the transparent thermoplastic resin 502, the front side (the light receiving side) of the photovoltaic element 503 is covered by the transparent surface protective member 501, and the back side of the photovoltaic element 503 is covered by the insulating back face protective member 504.

The surface protective member 501 comprises a transparent resin film made of a fluororesin such as ETFE (ethylene-tetrafluoroethylene copolymer) or PVF (polyvinyl fluoride), or a glass plate. The thermoplastic resin 502 comprises EVA (ethylene-vinyl acetate copolymer) or butyral resin. The back face protective member 504 comprises an organic film such as a nylon film or a composite comprising an aluminum foil sandwiched with TEDLAR (trademark name).

The back face protective member 504 is used in order to reinforce the solar cell module while adding an appropriate rigidity thereto.

The thermoplastic resin 502 serves as a filler enclosing the photovoltaic element 503 so as to prevent the photovoltaic element from being externally damaged and from external shock. The thermoplastic resin 502 also serves not only as an adhesive between the photovoltaic element 503 and the surface protective member 501 (that is, the fluororesin film) but also as an adhesive between the photovoltaic element 503 and the back face protective member 504.

Now, the filler (comprising the thermoplastic resin) is used for covering irregularities of the photovoltaic element while ensuring the adhesion of the photovoltaic element with not only the surface protective member but also the back face protective member. Therefore, it is required for the filler to have sufficient weatherability, adhesion properties, and heat resistance. Besides, the filler is also required to excel in long-term durability, endure against thermal expansion and heat contraction, and have flexibility.

As the filler, any transparent thermoplastic resins can be optionally used as long as they satisfy the above requirements. However, it is advantageous to use ethylene series copolymers because they excel particularly in heat resistance and adhesion properties and are relatively inexpensive. Of these ethylene series copolymers, EVA (ethylene-vinyl acetate copolymer) is the most often used.

In the case where the solar cell module is used under an environment with high temperatures, in order to ensure the adhesion of the filler (comprising the thermoplastic resin) with the photovoltaic element, the surface protective member, and the back face protective member under such severe environment, the filler is usually crosslinked with a crosslinking agent. Particularly in the case of using EVA as the filler, the EVA is usually crosslinked with a crosslinking agent comprising an organic peroxide.

However, in this case, such problems as will be described are liable to occur. The organic peroxide used as the crosslinking agent is liable to decompose an antioxidant added to the thermoplastic resin as the filler, resulting in deteriorating the weatherability of the filler. This situation becomes a serious drawback in the case where the thermoplastic resin as the filler situated on the light incident side (the front side) of the photovoltaic element is crosslinked with the organic peroxide as the crosslinking agent.

Besides, in the case where a solar cell module having a filler comprising a given thermoplastic resin such as EVA containing an organic peroxide as a crosslinking agent is prepared by means of vacuum lamination, sometimes the organic peroxide is not sufficiently removed and remains in the form of a bubble in the filler, whereby markedly deteriorating the bonding property and moisture resistance of the filler. In addition, gas is generated when the filler is crosslinked with the organic peroxide, and this gas tends to form a bubble in the filler, resulting in deteriorating the bonding property and moisture resistance of the filler. The formation of this bubble is more likely to occur upon rapid temperature rise.

Further, a relatively long period of time and a relatively large quantity of energy are required in order to crosslink the thermoplastic resin as the filler. This situation is a factor of making the resulting solar cell module costly.

For a photovoltaic element comprising a semiconductor layer as a photoelectric conversion member formed on an electrically conductive metal substrate and a transparent electrically conductive layer formed on said semiconductor layer which is used in a solar cell module, it is liable to have a short-circuit defect (a shunt) in which the substrate is short-circuited with the transparent electrically conductive layer due to irregularities present at the surface of the substrate or/and unevenness in the film formation. This short-circuit defect can be repaired by means of the so-called passivation treatment. However, the photovoltaic element thus repaired is potentially in a state that it is likely to be again shunted. This situation is facilitated particularly when moisture is present therein.

In the case of a solar cell module in which such repaired photovoltaic element is used having a fluororesin film as the surface protective member, the fluororesin film as the surface protective member has difficultly functioning as a barrier to sufficiently prevent moisture from invading into the solar cell module. In this case, when the photovoltaic element is sealed by a filler comprising an EVA having a high hygroscopic property, the solar cell module is not always satisfactory in terms of assuring the stability of the solar cell module upon continuous use under an environment with high temperature and high humidity over a long period of time.

In the case where a glass fiber is provided in the filler in order to protect the surface of the photovoltaic element, the above moisture invasion phenomenon is facilitated by way of the capillary action of the glass fiber.

For the EVA as filler by which the photovoltaic element is sealed, there is a tendency that the acetic acid radical is hydrolyzed in the present of moisture to liberate acetic acid. The liberated acetic acid is liable to corrode the surface of the transparent and electrically conductive layer, resulting in facilitating to shunt the photovoltaic element.

SUMMARY OF THE INVENTION

The present invention makes it an object to eliminate the foregoing problems found in the prior art and to provide an improved solar cell module which is free of said problems.

Another object of the present invention is to provide a highly reliable solar cell module which excels particularly in weatherability and moisture resistance and has good exterior appearance, and which can be used as a building construction material such as a roofing material.

A further object of the present invention is to provide a highly reliable solar cell module having an improved surface side covering material with a filler comprising a non-crosslinked organic polymer resin and a crosslinked organic polymer resin laminated on at least a surface of said non-crosslinked organic polymer resin. Said solar cell module excels particularly in weatherability and moisture resistance and has good exterior appearance, and it can be used as a building construction material such as a roofing material.

A further object of the present invention is to provide a process for the production of the above solar cell module.

BRIEF DESCRIPTION OF THE DRAWINGS

FIG. 2(*b*) is a schematic plan view illustrating a light receiving face of the photovoltaic element shown in FIG. 2(*a*).

FIG. 3(*b*) is a schematic cross-sectional view illustrating the constitution of a further example of a solar cell module according to the present invention.

DESCRIPTION OF THE INVENTION AND PREFERRED EMBODIMENTS

Figure 1:
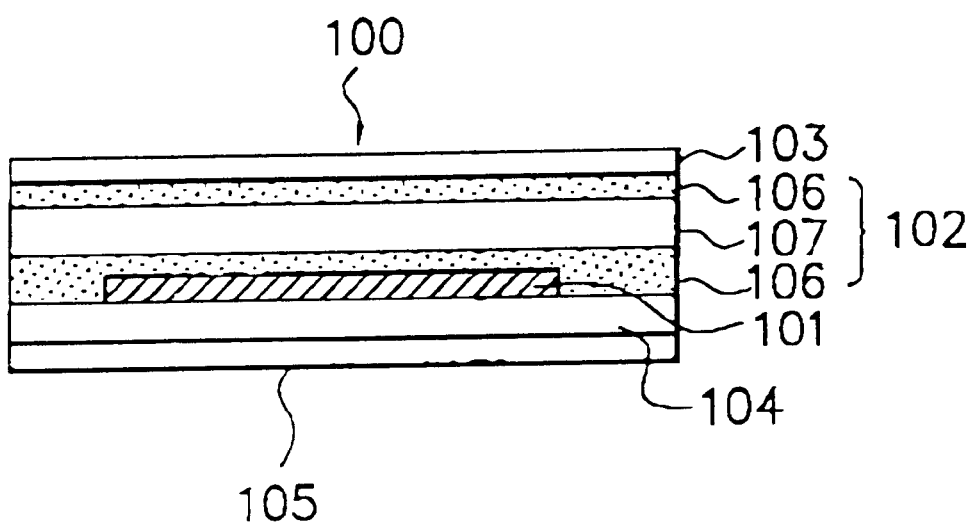
FIG. 1 is a schematic cross-sectional view illustrating the constitution of an example of a solar cell module according to the present invention.

The present invention eliminates the foregoing problems found in the conventional solar cell module and attains the above described objects.

The present invention provides a solar cell module having at least a surface side filler and a surface protective member laminated in the named order on a light incident face (a light receiving face) of a photovoltaic element, characterized in that said filler comprises a non-crosslinked organic polymer resin and a crosslinked organic polymer resin laminated on at least a surface of said non-crosslinked organic polymer resin. Any of the non-crosslinked organic polymer resin and the crosslinked organic polymer resin may be of such a configuration that the non-crosslinked organic polymer resin or the crosslinked organic polymer resin is impregnated in a glass fiber member.

The solar cell module according to the present invention is highly reliable. Particularly, in the solar cell module according to the present invention, because of using the specific surface side filler comprising the non-crosslinked organic polymer resin and the crosslinked organic polymer resin, the photovoltaic element is desirably sealed by the filler with an improved adhesion and the surface protective member is desirably with the surface side filler with an improved adhesion. Hence, the solar cell module has improved weatherability and moisture resistance, it excels in durability even upon continuous use under severe environment with high temperature and high humidity over a long period of time, and it has good exterior appearance.

The solar cell module according to the present invention can be bent as desired, and it can be used as a building construction material such as a roofing material.

In the following, the present invention will be described in more detail while referring to the drawings.

FIG. 1 is a schematic cross-sectional view illustrating the constitution of an example of a solar cell module according to the present invention. In the following, detailed description will be made of the solar cell module according to the present invention.

In FIG. 1, reference numeral 101 indicates a photovoltaic element, reference numeral 102 a transparent or substantially transparent filler (this filler will be hereinafter referred to as surface side filler), reference numeral 103 a transparent or substantially transparent member which is positioned at the outermost surface (this member will be hereinafter referred to surface protective member), reference numeral 104 a filler on the rear side of the photovoltaic element 101 (this filler will be hereinafter referred to as backside filler), and reference numeral 105 a back face protective member.

In the solar cell module shown in FIG. 1, light 100 is impinged through the side of the surface protective member 103, and the light impinged passes through the surface protective member 103 and the surface side filler 102 to arrive in the photovoltaic element 101. A photoelectromotive force generated in the photovoltaic element 101 is outputted through outputting terminals (not shown).

In the following, each of the constituents of the solar cell module shown in FIG. 1 will be detailed.

Surface Side Filler

The surface side filler 102 comprises a crosslinked organic polymer resin 106 laminated on at least one of opposite surfaces of a non-crosslinked organic polymer resin 107.

It is possible for the non-crosslinked organic polymer resin 107 to have another crosslinked organic polymer resin 106 laminated on the remaining surface thereof as shown in FIG. 1.

Each of the crosslinked organic polymer resin 106 and the non-crosslinked organic polymer resin 107 comprises a transparent thermoplastic polymer resin.

The lamination of the crosslinked organic polymer resin 106 on one of the opposite surfaces of the non-crosslinked organic polymer resin 107 is conducted by way of thermocompression bonding.

At least one of the crosslinked organic polymer resin 106 and the non-crosslinked organic polymer resin 107 is desired to have been impregnated in a glass fiber in advance Crosslinking a given transparent thermoplastic polymer resin in order to obtain the crosslinked organic polymer resin 106 may be conducted in a manner of adding a crosslinking agent to the transparent thermoplastic polymer resin and subjecting the transparent thermoplastic polymer resin added with the crosslinking agent to heat treatment or/and compression treatment.

The use of the surface side filler 102 structured as above described in the production of a solar cell module provides such significant advantages as will be described below.

(1). The resulting solar cell module has excellent weatherability. Particularly, because the non-crosslinked organic polymer resin 107 containing no crosslinking agent is used in the surface side filler, adverse effects due to the crosslinking agent found in the prior art can be prevented from occurring and as a result, a surface side covering material excelling in weatherability can be attained. This situation makes it possible to attain a highly reliable solar cell module have excellent weatherability.

(2). The resulting solar cell module excels in adhesion among the constituents. That is, the constituents for a solar cell module which have been laminated by way of vacuum lamination treatment are tightly contacted with each other with an improved adhesion. Particularly, because the crosslinked organic polymer resin 106 is arranged between the surface protective member 103 and the non-crosslinked organic polymer resin 107 or/and between the photovoltaic element 101 and the non-crosslinked organic polymer resin 107, the adhesion of the non-crosslinked organic polymer resin 107 as a principal constituent of the filler 102 with the surface protective member 103 or/and the photovoltaic element 101 is remarkably ensured.

(3). The resulting solar cell module has good exterior appearance. When either the crosslinked organic polymer resin or the non-crosslinked organic polymer resin, which are used as the surface side filler, is impregnated in a glass fiber prior to using them, defects of resin-impregnation in the glass fiber are substantially avoided upon subjecting these resins to vacuum lamination treatment for the production of a solar cell module. Residual bubbles due to the volatilization of the crosslinking agent as found in the prior art does not occur. This situation makes it possible to attain a highly reliable solar cell module having good exterior appearance.

(4). The resulting solar cell module excels in moisture resistance. For the surface side filler comprising a layer of the crosslinked organic polymer resin and a layer of the non-crosslinked organic polymer resin, one of these layers has no glass fiber. Because of this, moisture invasion is desirably prevented and therefore, problems due to acetic acid liberation as found in the prior art is prevented, where the photovoltaic element is desirably prevented from suffering from moisture invasion. This situation makes it possible to attain a highly reliable solar cell module having excellent moisture resistance.

The organic polymer resin used as the surface side filler 102 can include EVA (ethylene-vinyl acetate copolymer), PVB (polyvinyl butyral), epoxy resins, acrylic resins, silicone resins, and fluororesins.

As the crosslinked organic polymer resin 106, it is desired to use a given organic polymer which has been crosslinked in advance, in order to shorten the period of time required for the production of a solar cell module. However, said organic polymer resin may be crosslinked upon the production of a solar cell module.

To crosslink a given organic polymer resin in order to form the crosslinked organic polymer resin 106 may be conducted using an appropriate crosslinking agent. The crosslinking agent can include isocyanates, melamines, and organic peroxides. Of these, organic peroxides are the most appropriate.

Description will be made of the crosslinking using such organic peroxide.

The crosslinking of an organic polymer resin by means of an organic peroxide as the crosslinking agent is performed by way of drawing hydrogen atoms or halogen atoms in the resin by virtue of free radicals generated from the organic peroxide to form C—C bonds.

In order to make the organic peroxide generate such free radicals upon crosslinking the organic polymer resin, the organic peroxide can be activated by means of the thermal decomposition process, redox decomposition process, or ion decomposition process. Of these processes, the thermal decomposition process is the most appropriate.

The organic peroxide usable as the crosslinking agent in the present invention can include hydroperoxide, dialkyl (diallyl) peroxide, diacyl peroxide, peroxyketal, peroxyester, peroxycarbonate, and ketone peroxide.

The amount of such organic peroxide as the crosslinking agent to be added to the starting organic polymer resin can be preferably in the range of from 0.1 to 5 wt. % versus the amount of organic polymer resin.

The formation of the crosslinked organic polymer resin 106 may be conducted by mixing a given organic polymer resin with a given organic peroxide as the crosslinking agent, followed by heat treatment under pressure. The heat treatment under pressure may be conducted by means of heated roll or heat press or a processing manner wherein an object to be processed is enclosed in an air bag-like shaped instrument and the inside of the instrument is evacuated to press the object by virtue of atmospheric pressure while heating the object.

Conditions of the temperature and the period of time for the heat treatment under pressure should be determined depending upon the thermodecomposition temperature property of the organic peroxide used. However, in general, these conditions are determined to be such that 90% or more or preferably, 95% or more of the organic peroxide in the organic polymer resin is thermally decomposed and the organic polymer resin has a gel fraction of 60% or more or preferably, 80% or more.

Herein, the non-crosslinked organic polymer resin 107 is meant to have a gel fraction of 20% or less.

Now, the gel fraction of an organic polymer resin can be determined, for instance, in the following manner.

About 1 g of a specimen of an organic polymer resin to be examined is introduced into a cylindrical filter paper whose weight has been measured. The cylindrical filter paper containing the specimen therein is set to a Soxhlet extractor, where the specimen in the cylindrical filter paper is subjected to extraction using about 100 ml of xylene for 6 hours. The cylindrical filter paper containing an unresolved residue of the specimen therein is air-dried in a draft chamber for 12 hours, followed by subjecting to drying in a hot-air circulating oven maintained at 80° C. for more than 6 hours, then followed by standing at room temperature. The cylindrical filter paper containing the unresolved residue of the specimen is subjected to weight measurement. The weight of the cylindrical filter paper is subtracted from the weight of the cylindrical filter paper containing the unresolved residue of the specimen to obtain a weight of the unresolved residue. The weight of the unresolved residue is divided by the weight of the starting specimen to obtain a value. This value is made to be a gel fraction of the organic polymer resin.

In order to efficiently crosslink the organic polymer resin, it is desired to use a crosslinking assistant such as triarylcyanurate in addition to the crosslinking agent.

In this case, the amount of the crosslinking assistant to be added is desired to be in the range of from 0.1 to 5 wt. % versus the amount of the organic polymer resin.

In order to further improve the stability of the surface side filler 102 at high temperature, the surface side filler may contain an appropriate antioxidant. The antioxidant can be added to both the crosslinked organic polymer resin 106 and the non-crosslinked organic polymer resin 107. The amount of the antioxidant to be added in any case is preferred to be in the range of 0.1 to 1 part by weight versus 100 parts by weight of the organic polymer resin.

The antioxidant usable herein can include monophenol series antioxidant, bisphenol series antioxidant, high-molecular phenol series antioxidant, sulfur series antioxidant, and phosphorous series antioxidant.

In the case where the solar cell module is used under severe environmental conditions, it is desired to have a marked adhesion between the surface side filler and the photovoltaic element and also between the surface side filler and the surface protective member. In order for the surface side filler to attain such adhesion, it is effective to add an appropriate silane coupling agent or an appropriate organic titanate compound to the crosslinked organic polymer resin 106 or the non-crosslinked organic polymer resin 107, which is directly contacted with the photovoltaic element or the surface protective member.

The surface side filler in the present invention essentially excels in weatherability. However, in order to attain a further improved weatherability for the surface side filler and also in order to effectively protect a layer situated under the surface side filler, it is possible for the surface side filler to contain an appropriate UV absorber.

The amount of the UV absorber to be added is preferred to be in the range of 0.1 to 0.5 part by weight versus 100 parts by weight of the resin constituting the surface side filler.

The UV absorber usable herein can include commercially available chemical compounds usable as a UV absorber. Specifically, those chemical compounds can include salicylic acid series compounds, benzophenone series compounds, benzotriazole series compounds, and cyanoacrylate series compounds.

Further, in order for the surface side filler to have a further improved weatherability to effectively prevent the surface side filler from suffering from photodeterioration, it is possible for the surface side filler to contain an appropriate hindered amine series light stabilizer in addition to the foregoing UV absorber. Although the hindered amine series light stabilizer does not serve to absorb ultraviolet rays as the foregoing UV absorber does, a pronounced advantage is provided by using the hindered amine series light stabilizer in combination with the UV absorber.

The amount of the hindered amine series light stabilizer to be added is preferred to be in the range of 0.1 to 0.3 part by weight versus 100 parts by weight of the resin constituting the surface side filler.

With consideration of use environmental conditions for a solar cell module in which the surface side filler is disposed, any of the foregoing antioxidant, UV absorber and light stabilizer is desired to be low in volatility.

Now, in order to prevent a decrease in the quantity of incident light to be arriving in the photovoltaic element, the surface side filler 102 is desired to be substantially transparent. Specifically, it is desired for the surface side filler to have a light transmittance of preferably 80% or more or more preferably 90% or more in a visible light wavelength region of 400 nm to 800 nm. Further, in order to facilitate external light to be readily impinged into the photovoltaic element, the surface side filler is made to be such that it has a refractive index of preferably 1.1 to 2.0 or more preferably 1.1 to 1.6 at a temperature of 25° C.

Photovoltaic Element

The photovoltaic element 101 may be a single crystal silicon photovoltaic element (or a single crystalline silicon solar cell), a non-single crystalline silicon photovoltaic element (or a non-single crystalline silicon solar cell) including a polycrystalline silicon photovoltaic element (or a polycrystalline silicon solar cell) and an amorphous silicon (a-Si) photovoltaic element (or an a-Si solar cell), or a chemical compound semiconductor photovoltaic element (or a chemical compound semiconductor solar cell) including a copper-indium-selenide photovoltaic element (or a copper-indium-selenide solar cell).

Figure 2A:
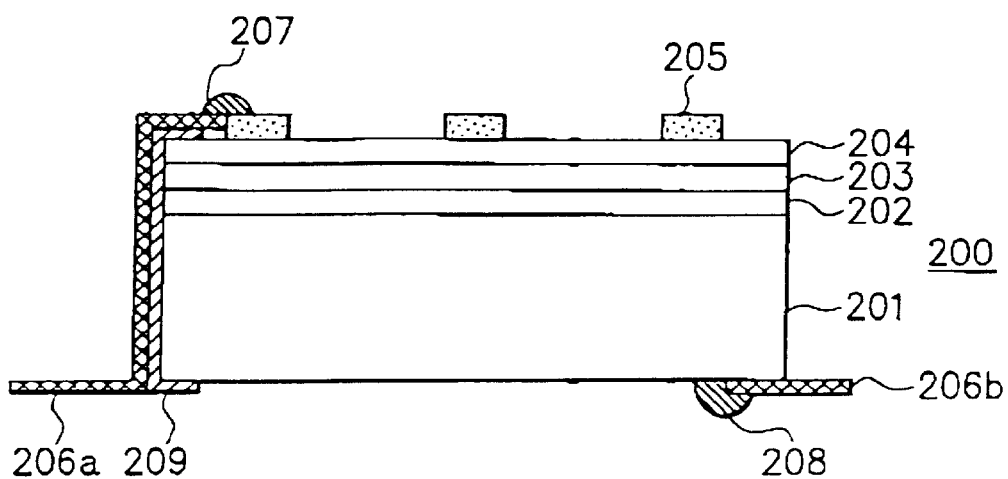
FIG. 2(*a*) is a schematic cross-sectional view illustrating the constitution of an example of a photovoltaic element which can be used in the present invention.

FIG. 2(a) is a schematic cross-sectional view illustrating the constitution of an example of such photovoltaic element (solar cell).

Figure 2B:
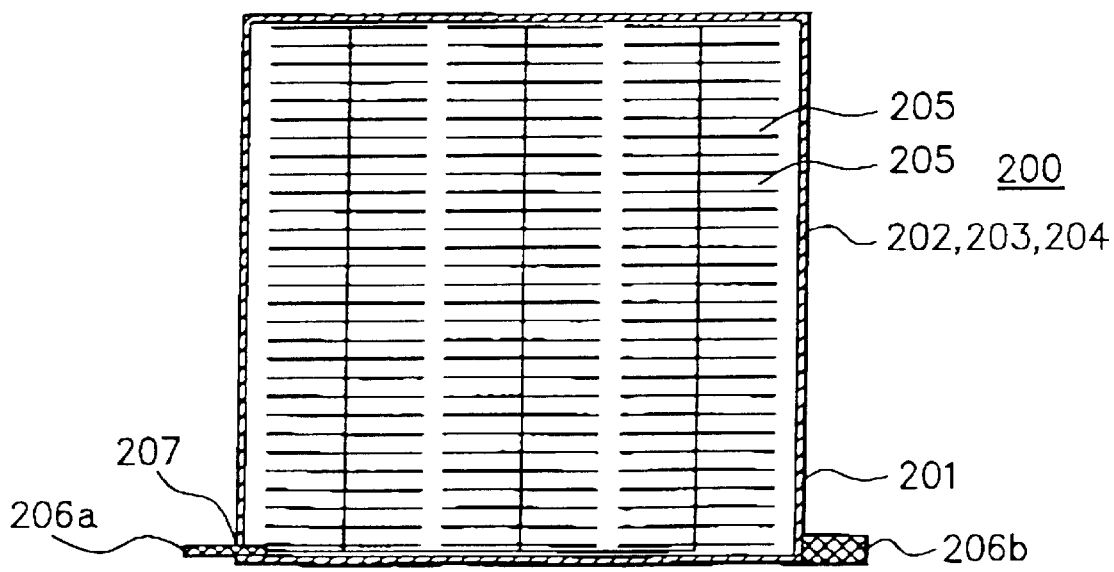

FIG. 2(b) is a schematic plan view illustrating the light receiving face of the photovoltaic element shown in FIG. 2(a).

In FIGS. 2(a) and 2(b), reference numeral 200 indicates the entire photovoltaic element, reference numeral 201 an electrically conductive substrate, reference numeral 202 a back reflecting layer, reference numeral 203 a photo-active semiconductor layer, reference numeral 204 a transparent and electrically conductive layer, reference numeral 205 a collecting electrode (or a grid electrode), reference numeral 206a a positive power output terminal, reference numeral 206b a negative power output terminal, reference numeral 207 an electrically conductive adhesive, reference numeral 208 a solder, and reference numeral 209 an insulating member.

As apparent from FIGS. 2(a) and 2(b), the photovoltaic element 200 comprises the back reflecting layer 202, the photo-active semiconductor layer 203, the transparent and electrically conductive layer 204, and the collecting electrode 205 disposed in this order on the electrically conductive substrate 201, wherein the output terminal 206a is electrically connected to the collecting electrode 205 by means of the electrically conductive adhesive 207 and it extends from the collecting electrode 205 while being insulated from the various layers 201–204 by means of the insulating member 209, and the output terminal 206b is electrically connected to the electrically conductive substrate 201 by means of the solder 208. In this configuration, the positive power output terminal and the negative power output terminal may be changed into a negative power output terminal and a positive power output terminal, depending upon the constitution of the photo-active semiconductor layer.

In the following, each of the constituents of the photovoltaic element (the solar cell) shown in FIGS. 2(a) and 2(b) will be detailed.

Electrically Conductive Substrate

The electrically conductive substrate 201 serves not only as a substrate for the photovoltaic element but also as a lower electrode. As for the electrically conductive substrate 201, there is no particular restriction as long as it has an electrically conductive surface. Specifically, it may be an electrically conductive member composed of a metal such as Ta, Mo, W, Al, Cu, Ti, or the like, or an electrically conductive member composed of an alloy of these metals as stainless steel. Other than these, the electrically conductive substrate may comprise a carbon sheet or a Pb-plated steel sheet. Alternatively, the electrically conductive substrate may be a film or sheet made of a synthetic resin or a sheet made of a ceramic. In this case, the substrate is deposited with an electrically conductive film of $SnO_2$, $ZnO_2$, ITO, or the like on the surface thereof.

Back Reflecting Layer

The back reflecting layer 202 disposed on the electrically conductive substrate 201 may comprise a metal layer, a metal oxide layer, or a two-layered structure comprising a metal layer and a metal oxide layer.

The metal layer may be composed of a metal such as Ti, Cr, Mo, W, Al, Ag, Ni, or the like. The metal oxide layer may comprise an oxide of said metals, or other metal oxide such as ZnO, $SnO_2$, or the like.

The back reflecting layer 202 is desired to have a roughened surface in order to make incident light effectively utilized.

The back reflecting layer 202 may be properly formed by a conventional film-forming technique such as resistant heating evaporation, electron beam evaporation, or sputtering.

Photo-active Semiconductor Layer

The photo-active semiconductor layer 203 performs photoelectric conversion. The semiconductor photo-active layer may be composed of a single crystalline silicon semiconductor material, a non-single crystalline silicon semiconductor material such as an amorphous silicon semiconductor material (including a microcrystalline silicon semiconductor material) or polycrystalline silicon semiconductor material, or a compound semiconductor material. In any case, the photo-active semiconductor layer comprised of any of these semiconductor materials may be of a stacked structure with a pn junction, a pin junction or a Shottky type junction. Specific examples of the compound semiconductor materials and junctions are $CuInSe_2$, $CuInS_2$, GaAs, $CdS/Cu_2S$, CdS/CdTe, CdS/InP, $CdTe/Cu_2Te$, and the like.

The photo-active semiconductor layer comprised of any of the above mentioned semiconductor materials may be formed by a conventional film-forming technique. For instance, the non-single crystalline silicon photo-active semiconductor layer may be formed by a conventional chemical vapor phase deposition technique such as plasma CVD using a film-forming raw material gas capable of supplying silicon atoms, such as silane gas or a conventional physical vapor phase film-forming technique such as sputtering using a Si target.

The photo-active semiconductor layer composed of a polycrystalline silicon semiconductor material may be formed by a conventional polycrystalline silicon film-forming manner of providing a fused silicon material and subjecting the fused silicon material to film-forming processing or another conventional polycrystalline silicon film-forming manner of subjecting an amorphous silicon material to heat treatment.

The photo-active semiconductor layer composed of any of the above mentioned compound semiconductor materials may be formed by a conventional ion plating, ion beam deposition, vacuum evaporation, sputtering, or electrolytic technique in which a precipitate is deposited by means of electrolysis of a desired electrolyte.

Transparent and Electrically Conductive Layer

The transparent and electrically conductive layer 204 functions as an upper electrode. The transparent and electrically conductive layer may comprise $In_2O_3$, $SnO_2$, ITO ($In_2O_3$—SnO2), ZnO, $TiO_2$ or $Cd_2SnO_4$. Besides, it may comprise a crystalline semiconductor layer doped with an appropriate impurity with a high concentration.

The transparent and electrically conductive layer constituted by any of the above mentioned materials may be formed by a conventional resistant heating evaporation, electron beam evaporation, sputtering, spraying, or CVD.

The above described impurity-doped crystalline semiconductor layer as the transparent and electrically conductive layer may be formed by a conventional impurity-diffusion film-forming method.

By the way, for a photovoltaic element obtained by forming until a transparent and electrically conductive layer, namely, said photovoltaic element comprising a back reflecting layer 202, a photo-active semiconductor layer 203, and a transparent and electrically conductive layer 204 sequentially formed in this order on an electrically conductive substrate 201, it is occasionally in a state of having a relatively small leak resistance (that is, a relatively small shunt resistance) in that the electrically conductive substrate and the transparent and electrically conductive layer are partially short-circuited to cause flow of a relatively large quantity of leakage current in proportion to a power outputted. This defect can repaired by subjecting the photovoltaic element to passivation treatment. Particularly, it is desired for the photovoltaic element having such defect to be repaired by means of passivation treatment to have a shunt resistance of preferably 1 k$\Omega \cdot cm^2$ to 500 k$\Omega \cdot cm^2$ or more preferably 10 k$\Omega \cdot cm^2$ to 500 k$\Omega \cdot cm^2$.

Collecting Electrode

The collecting electrode 205 (or the grid electrode) serves to effectively collect the electric current generated by virtue of a photoelectromotive force on the transparent and conductive layer 204. The collecting electrode is desired to be in the shape of a comb.

The collecting electrode may comprise a metal such as Ti, Cr, Mo, W, Al, Ag, Ni, Cu, Sn, or an alloy of these metals. Alternatively, the collecting electrode may be formed of an electrically conductive paste. The electrically conductive paste can include electrically conductive pastes comprising powdery Ag, Au, Cu, Ni, or carbon dispersed in an appropriate binder resin. The binder resin can include polyester, epoxy resin, acrylic resin, alkyd resin, polyvinyl acetate, rubber, urethane resin, and phenol resin.

The collecting electrode may be formed by a conventional sputtering using a mask pattern, resistant heating evaporation, or CVD. It may also be formed in a manner of depositing a metal film over the entire surface and subjecting the metal film to etching treatment to form a desired pattern, directly forming a grid electrode pattern by means of photo-induced CVD, or by forming a negative pattern corresponding to a grid electrode pattern and subjecting the resultant to plating treatment.

In the case of using any of the foregoing electrically conductive pastes, the collecting electrode may be formed in a manner of screen-printing the electrically conductive paste, fixing a metallic wire to the electrically conductive paste screen printed by means of a solder, or fixing a metallic wire by means of the electrically conductive paste.

Power Output Terminals

The power output terminals 206a and 206b serve to output an electromotive force. The output terminal 206a is electrically connected to the collecting electrode 205 by means of the electrically conductive paste 207 in FIG. 2(a). Alternatively, the electrical connection in this case may be formed by using an appropriate connecting metal body and an electrically conductive paste or solder.

The output terminal 206b is electrically connected to the electrically conductive substrate by means of the solder 208 in FIG. 2(a). Alternatively, the electrical connection in this case may be formed by spot welding or soldering an appropriate metal body such as copper tab.

There are provided a plurality of photovoltaic elements having the above constitution, and they are integrated in series or parallel connection depending upon the desired voltage or electric current. It is possible to dispose the integrated body on an insulating member such that a desired voltage or electric current can be obtained.

Now, description will be made of other constituents of the solar cell module shown in FIG. 1.

Surface Protective Member

The surface protective member 103 is positioned at the outermost surface of the solar cell module and because of this, it is required to excel in transparency, weatherability, water repellency, heat resistance, pollution resistance and physical strength. In addition, in the case where the solar cell module is used under severe environmental conditions outdoors, it is required for the surface protective member to ensure that the solar cell module has sufficient durability upon repeated use over a long period of time.

Therefore, the surface protective member comprises a member which satisfies all these conditions. Such member includes tempered glass members and fluororesin films. The tempered glass member excels in transparency and impact resistance and is hardly broken. Therefore it has been widely used as the surface protective member (the front surface protective member) of a solar cell module.

However, in recent years, there is an increased demand for the solar cell module to be light weight and excel in flexibility. In order to meet this demand, the surface protective member 103 is desired to comprise a highly transparent fluororesin film which excels especially in weatherability and pollution resistance.

Specific examples of such highly transparent fluororesin are ethylene-tetrafluoroethylene copolymer (ETFE), polyvinyl fluoride resin (PVF), polyvinylidene fluoride resin (FVdF), polytetrafluoroethylene resin (PTFE), tetrafluoroethylene-hexafluoropropylene copolymer (FEP), and polychlorotrifluoroethylene resin (PCTFE). Of these fluororesins, FVdF is the best in terms of weatherability. In terms of weatherability and physical strength in combination, ETFE is the best.

In order to attain a further improvement in the adhesion of the surface protective member 103 with the surface side filler 102, the surface of the surface protective member to be contacted with the surface side filler is desired to be subjected to surface treatment. The surface treatment in this case can include corona discharging treatment and plasma treatment.

Further, as the fluororesin film used as the surface protective member, it is possible to use an oriented highly transparent fluororesin film in order for the surface protective member to have an improved physical strength.

Backside Filler

The backside filler 104 serves to provide adhesion between the photovoltaic element 101 and the back face protective member 105. The backside filler 104 preferably comprises a material capable of sufficiently ensuring the adhesion between the electrically conductive substrate (201) of the photovoltaic element 101 and the back face protective member 105 and which excels in long-term durability, withstands thermal expansion and thermal contraction, and excels in flexibility.

Specific examples of such material are hot-melt materials such as EVA (ethylene-vinyl acetate copolymer) and polyvinyl butyral, and epoxy adhesives. Besides these, double-coated tapes may also be used.

Back Face Protective Member

The back face protective member 105 is used for electrically isolating the electrically conductive substrate (201) of the photovoltaic element 101 from external materials (including a back face reinforcing member (not shown) and the like).

The back face protective member 105 is desired to be composed of a material capable of sufficiently electrically isolating the electrically conductive substrate of the photovoltaic element and which excels in long-term durability, withstands a thermal expansion and thermal contraction, and excels in flexibility. Specific examples of such material are fluororesins, nylon, polyethylene terephthalate (PET), and the like.

In the present invention, it is possible to fix a back face reinforcing member (not shown in the figure) to the exterior of the back face protective member 105 with the use of an appropriate organic resin in order to improve the mechanical strength of the solar cell module and in order to prevent the solar cell module from being distorted or warped due to a change in the environmental temperature. The back face reinforcing member may comprise a steel plate, a plastic plate, or a fiber-glass reinforced plastic plate (or so-called FRP plate).

Figure 4A:
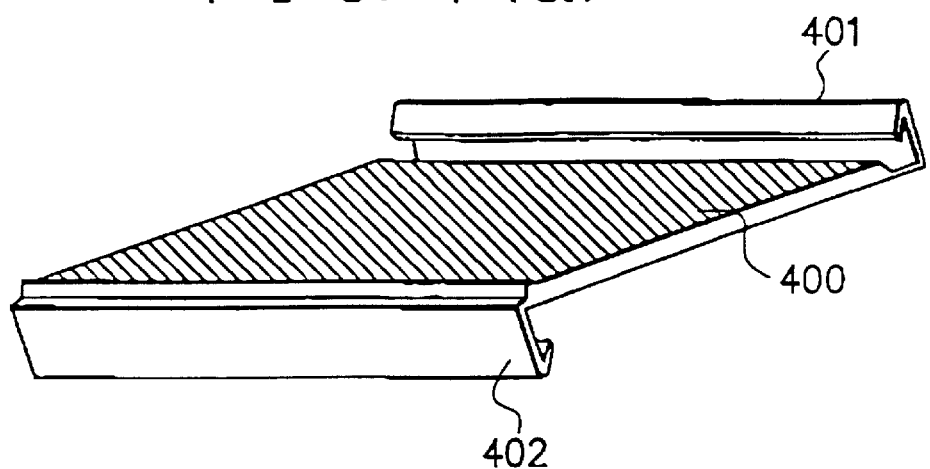
FIGS. 4(*a*) to 4(*c*) are schematic views respectively illustrating an embodiment where a solar cell module according to the present invention is used as a roofing material of a building.
Figure 4B:
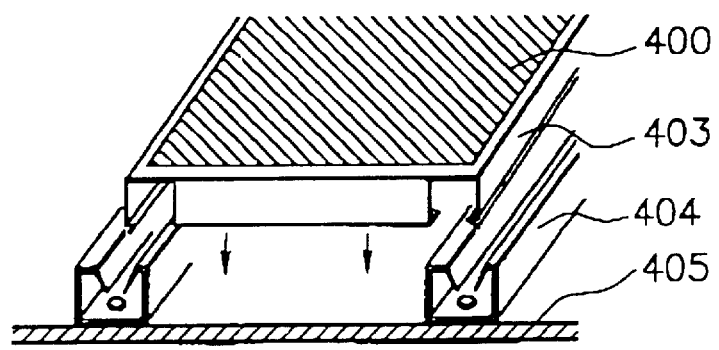
Figure 4C:
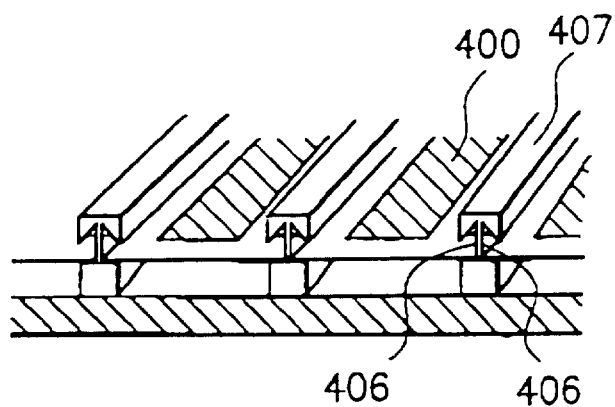
Figure 5:
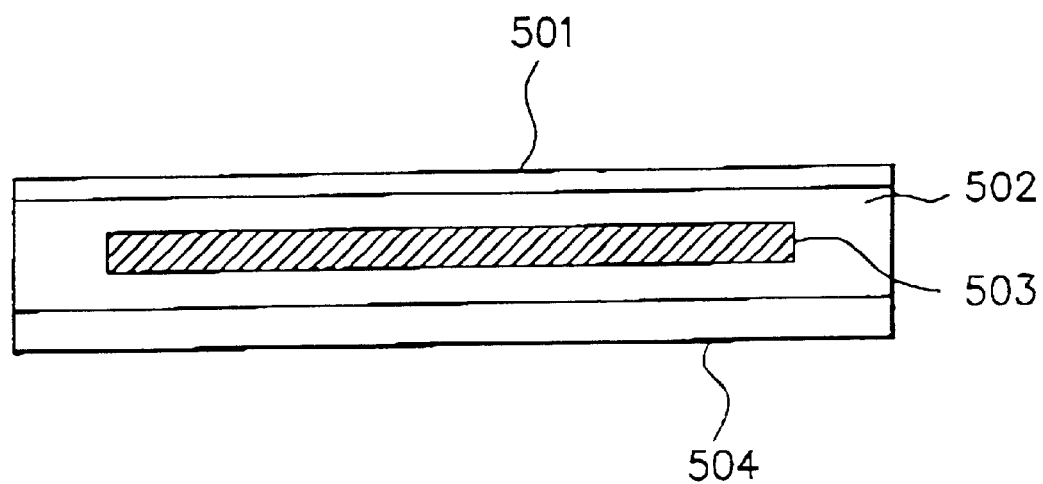
FIG. 5 is a schematic cross-sectional view illustrating the constitution of an example of a conventional solar cell module.

The solar cell module provided with such back face reinforcing member according to the present invention may be designed to use as a building construction member, specifically, as a roofing member by bending the extended portions with no solar cell. FIGS. 4(a) to 4(c) are schematic views respectively illustrating an embodiment where the solar cell module according to the present invention is designed to be capable of use as a roofing member.

FIG. 4(a) shows an embodiment where a solar cell module according to the present invention is designed into a roofing member having a light receiving face 400 (comprising a power generation region containing a solar cell), a ridge side joint portion 401, and an eaves side joint portion 402. When this roofing member is arranged on a roof of a building, the ridge side joint portion 401 of the rooting member is engaged in mesh with an eaves side joint portion of a second roofing member situated next to the roofing member, and the eaves side joint portion 402 of the roofing member is engaged in mesh with a ridge side joint portion of a third roofing member.

FIG. 4(b) shows an embodiment where a solar cell module according to the present invention is placed on a roof of a building as a roofing member. Particularly, the solar cell module shown in FIG. 4(b) is designed into a roofing member having a light receiving face 400 (comprising a power generation region containing a solar cell) and four extended joint portions 403 which are bent toward the side opposite the light receiving face. And the solar cell module is arranged on receiving members 404 fixed to a roof plate 405 by means of bolts, then the solar cell module is pressed from above, whereby the extended joint portions 403 are engaged in the receiving members 404.

FIG. 4(c) shows an embodiment where a plurality of solar cell modules each designed to have a light receiving face 400 (comprising a power generation region containing a solar cell) and opposite solar cell-free extended joint portions 406 according to the present invention are placed on a roof of a building, wherein adjacent extended portions of the two solar cell modules are engaged in a common fixing cap 407.

Now, the solar cell module according to the present invention, which can used as a building construction member as above described, may be used together with a power conversion device capable of converting a power outputted from a solar cell into an AC power to establish a sunlight power generation apparatus. The power generation apparatus may be designed to have a function to link with a commercial electric power supply system.

In the following, description will be made of a process for the production of a solar cell module according to the present invention. In the present invention, the production of the solar cell module may be conducted by way of vacuum lamination using a conventional vacuum laminator. The vacuum laminator comprises a mounting table made of a metal which is provided with an electric heater and an exhaust system connected to a vacuum pump, a release member, and a silicone rubber sheet. The production of a solar cell module using the vacuum laminator is conducted, for instance, in the following manner.

The release member is placed on the surface of the mounting table. Then, there are laminated a back side covering material, a photovoltaic element (a solar cell) and a surface side covering material in the named order on the release member to form a stacked body on the release member. The silicone rubber sheet is placed over the stacked body to seal the stacked body between the surface of the mounting table and the silicone rubber sheet while using an O-ring (the resultant will be hereinafter referred to as air bag system). Thereafter, the interior space of the air bag system containing the stacked body between the surface of the mounting table and the silicone rubber sheet is evacuated to a predetermined vacuum degree by means of the vacuum pump. Then, under reduced pressure, the stacked body thus vacuum-treated in the air bag system is introduced into an oven maintained at a desired temperature of, for instance, 80 to 200° C. which is suitable for bonding the surface side covering material and the back side covering material to the photovoltaic element so that the photovoltaic element is covered by the surface side covering material and the back side covering material, wherein the stacked body is subjected to heat treatment for a predetermined period of time. And still under reduced pressure, the stacked body is cooled. Thus, there is obtained a solar cell module.

In the following, the present invention will be described in more detail with reference to examples. It should be understood that these examples are only for illustrative purposes and the present invention is not restricted to these examples.

EXAMPLE 1

1. Preparation of Solar Cell

There was prepared a photovoltaic element having the configuration shown in FIGS. 2(a) and 2(b) and which has a photo-active semiconductor layer composed of an amorphous silicon material (that is, a-Si material) in the following manner.

That is, there was firstly provided a well-cleaned stainless steel plate as the substrate 201. On the substrate, there was formed a two-layered back reflecting layer 202 comprising a 5000 Å thick Al film/a 5000 Å thick ZnO film by means of a conventional sputtering process.

On the back reflecting layer 202 thus formed, there was formed a tandem type photoelectric conversion semiconductor layer as the semiconductor photo-active layer 203 comprising a 150 Å thick n-type amorphous silicon layer/a 4000 Å thick i-type amorphous silicon layer/a 100 Å thick p-type microcrystalline silicon layer/a 100 Å thick n-type amorphous silicon layer/a 800 Å thick i-type amorphous silicon layer/a 100 Å thick p-type microcrystalline silicon layer laminated in the named order from the substrate side by means of a conventional plasma CVD process, wherein each n-type amorphous silicon layer was formed using a mixture of $SiH_4$ gas, $PH_3$ gas and $H_2$ gas, each i-type amorphous silicon layer was formed using a mixture of $SiH_4$ gas and $H_2$ gas, and each p-type microcrystalline silicon layer was formed using a mixture of $SiH_4$ gas, $BF_3$ gas and $H_2$ gas. Then, on the photo-active semiconductor layer 203, there was formed a 700 Å thick transparent and electrically conductive layer 204 composed of $In_2O_3$ by means of a conventional heat resistance evaporation process wherein an In source was evaporated in an $O_2$ atmosphere.

As a result of examining the resultant photovoltaic element, the photovoltic element was found to have a shunt resistance in the range of 1 to 10 $k\Omega \cdot cm^2$. Hence the photovoltic element was found to have short-circuited portions (or shunted portions) at the transparent and electrically conductive layer. In this connection, the photovoltaic element was subjected to defect-removing treatment (passivation treatment) as will be described in the following.

The photovoltaic element was immersed in an electrolyte solution (comprising an aluminum chloride aqueous solution having an electric conductivity of 50 to 70 mS) contained in a vessel and an electrode plate was immersed in the aluminum chloride aqueous solution so as to oppose the transparent and electrically conductive layer of the photovoltaic element. The substrate of the photovoltaic element was electrically grounded, and a positive electric potential of 3.5 V was applied to the electrode plate, where the short-circuited portions of the transparent and electrically conductive layer of the photovoltaic element were selectively passivated. As a result of examining the photovoltaic element thus treated, the photovoltaic element was found to have an improved shunt resistance in the range of 50 to 200 $k\Omega \cdot cm^2$.

On the transparent and electrically conductive layer of the repaired photovoltaic element, a grid electrode as the collecting electrode 205 was formed in the following manner. An Cu-paste comprising powdered Cu dispersed in a polyester resin was screen-printed to spacedly form a plurality of Cu-paste lines having a width of 200 µm at a substantially equal interval on the transparent and electrically conductive layer of the repaired photovoltaic element. Then, a Cu-wire having a diameter of 100 µm was arranged along each of the Cu-paste lines, followed by superposing a solder cream thereon, and the solder was fused to fix the Cu-wires on the Cu-paste. By this, there was formed a grid electrode as the collecting electrode 205 on the transparent and electrically conductive layer of the photovoltaic element. By this, there was obtained a solar cell.

The above procedures were repeated to obtain a plurality of solar cells.

10 of these solar cells were integrated in series connection by serially connecting each adjacent two solar cells in a manner of soldering one end of an electrically conductive connection member comprising a copper foil to the collecting electrode (205) of one of the two solar cells and soldering the other end of said electrically conductive connection member to the substrate (201) (comprising the stainless steel plate) of the remaining solar cell. For the resultant, a copper tub as the negative power output terminal 206b was fixed to the substrate (201) of one of the end-sided two solar cells using a stainless solder 208, and a tin foil tape as the positive power output terminal 206a was fixed to the collecting electrode (205) of the remaining end-sided solar cell using an electrically conductive adhesive 207.

Thus, there was obtained a cell group comprising the 10 solar cells integrated in series connection.

The above procedures were repeated to obtain a plurality of cell groups each comprising 10 solar cells integrated in series connection.

2. Preparation of Solar Cell Module

Using each of the cell groups obtained in the above step 1, there were prepared a plurality of solar cell modules each having the configuration shown in FIG. 3(a) in the following manner.

Figure 3A:
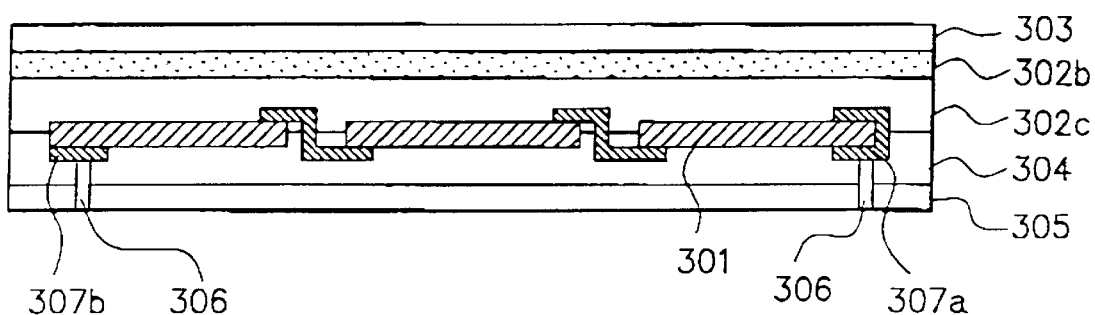
FIG. 3(*a*) is a schematic cross-sectional view illustrating the constitution of another example of a solar cell module according to the present invention.

In FIG. 3(a), reference numeral 301 indicates a cell group comprising a plurality of solar cells (photovoltaic elements) integrated in series connection (corresponding to the foregoing cell group in this case), reference numeral 302a a non-crosslinked organic polymer resin as a first constituent of a surface side filler, reference numeral 302b a crosslinked organic polymer resin as a second constituent of the surface side filler, reference numeral 303 a surface protective member, reference numeral 304 a backside filler, reference numeral 305 a back face reinforcing member, reference numeral 307a a positive power output terminal (corresponding to the foregoing power output terminal 206a) provided at the solar cell positioned at one end of the cell group 301, reference numeral 307b a negative power output terminal (corresponding to the foregoing power output terminal 206b) provided at the solar cell positioned at the other end of the cell group, and reference numeral 306 a pair of wiring holes each for one of the power output terminals 307a and 307b. Each wiring hole penetrates through the back face constituents from the back face reinforcing member 305 such that it reaches the corresponding power output terminal.

(1). Provision of a fluororesin film to be used as the surface protective member 303:

There was provided an ethylene-tetrafluoroethylene copolymer (ETFE) film of 50 $\mu$m in thickness having a corona-discharged surface to be contacted with the crosslinked organic polymer resin 302b.

(2). Preparation of a material to be used as the crosslinked organic polymer resin 302b:

To 100 parts by weight of an EVA resin (having a vinyl acetate content of 33%), 3 parts by weight of 2,5-dimethyl-2,5-bis(t-butylperoxy)hexane as a crosslinking agent, 0.3 part by weight of γ-methacryloxypropyltrimethoxysilane as a silane coupling agent, 0.3 part by weight of 2-hydroxy-4-n-octoxybenzophenone as a UV absorber, 0.1 part by weight of bis(2,2,6,6-tetramethyl-4-piperidyl)sebacate as a photostabilizer, and 0.2 part by weight of tris(mono-nonylphenyl) phosphate as an antioxidant were added to obtain an EVA resin mixture. The mixture was heat-fused to obtain a fused solid capable of using as the crosslinked organic polymer resin 302b. The fused solid was coated on the corona-discharged surface of the ETFE film as the surface protective member at a thickness of 20 $\mu$m.

By this, there was obtained a two-layered member comprising a coating layer as the crosslinked organic polymer resin 302B formed on the ETFE film as the surface protective member 303.

(3). Preparation of a material to be used as the non-crosslinked organic polymer resin 302a:

To 100 parts by weight of an EVA resin (having a vinyl acetate content of 25%), 0.3 part by weight of γ-methacryloxypropyltrimethoxysilane as a silane coupling agent, 0.3 part by weight of 2-hydroxy-4-n-octoxybenzophenone as a UV absorber, 0.1 part by weight of bis(2,2,6,6-tetramethyl-4-piperidyl)sebacate as a photostabilizer, and 0.2 part by weight of tris(mono-nonylphenyl) phosphate as an antioxidant were added to obtain an EVA resin mixture. The mixture was heat-fused to obtain a fused solid capable of using as the non-crosslinked organic polymer resin 302a. The fused solid was impregnated in a nonwoven glass fiber member. The nonwoven glass fiber member impregnated with the fused solid was subjected to slot die extrusion to form an EVA sheet of 400 $\mu$m in thickness to be used as the non-crosslinked organic polymer resin 302a.

(4). Provision of a material to be used as the backside filler 304:

There was provided an EVA sheet containing a crosslinking agent.

(5). Provision of a member to be used as the back face reinforcing member 305:

There was provided a galvanized steel sheet (a Zn-plated steel sheet) of 0.4 mm in thickness.

(6). Preparation of solar cell module:

On the light receiving face of the cell group obtained in the above step 1, there were laminated the EVA sheet obtained in the above step 2-(3) and the two-layered member comprising the coating layer and the ETE film obtained in the above step 2-(2) in the named order, where the coating layer of the two-layered member was made to contact with the EVA sheet. On rear face of the resultant, there were laminated the EVA sheet provided in the above step 2-(4) and the galvanized steel sheet provided in the above step 2-(5) in the named order. Thus, there was obtained a stacked body. The stacked body was placed on the mounting table of the foregoing vacuum laminator. Following the foregoing procedures using the vacuum laminator, the stacked body was subjected to heat treatment at 195° C. for 15 minutes while evacuating the inside of the system to a predetermined vacuum degree, followed by cooling to room temperature.

In the above, the power output terminal 307a was extended to the rear side of the cell group so that not only the power output terminal 307b but also the power output terminal 307a could be wired to the outside through the wiring holes 306 having been previously formed at the galvanized steel sheet. Thus, there was obtained a solar cell module.

In this way, there were obtained a plurality of solar cell modules.

In this example, since the nonwoven glass fiber member previously impregnated with the EVA resin containing various additives as above described is used, there is an advantage in that the period of time required for the vacuum lamination treatment using the laminator is short. There are also other significant advantages such that since the non-crosslinked EVA resin (that is, the non-crosslinked organic polymer resin 302a ) is used in the surface side filler, the surface side filler by which the solar cell is sealed is good in terms of weatherability, and since the crosslinked organic polymer resin 302b is interposed between the surface protective member 303 and the non-crosslinked organic polymer resin 302a, the adhesion between the surface protective member 303 and the non-crosslinked organic polymer resin 302a is markedly improved.

Evaluation

Using the resultant solar cell modules, evaluation was conducted with respect to (1) exterior appearance, (2) packing performance, (3) weatherability (including moisture resistance), (4) resistance to creeping, and (5) resistance to scratching.

The evaluated results obtained are collectively shown in Table 1. In Table 1, the lamination temperature (the temperature at which the oven was maintained upon the heat treatment under reduced Pressure) and the lamination time (the period of time during which the heat treatment under reduced pressure an the oven was conducted) are also shown.

The evaluation of each of the evaluation items (1) to (5) was conducted in the following manner.

(1) Evaluation of the exterior appearance:

For the solar cell module, its initial exterior appearance was optically observed. The observed result is shown in Table 1 on the basis of the following criteria.

◯: a case where neither peeling nor residual bubble are present in the surface side covering material; and X: a case where peeling and/or residual bubble are present in the surface side covering material.

(2) Evaluation of the packing performance:

The packing performance of the surface side covering material for the serially connected portions in the cell group enclosed in the solar cell module was optically observed. The observed result is shown in Table 1 on the basis of the following criteria.

◯: a case where neither peeling nor residual bubbles are present in the surface side covering material in the series connection portions of the cell group; and X: a case where peeling or/and residual bubbles are present in the surface side covering material in the series connection portions of the cell group.

(3) Evaluation of the weatherability (including the moisture resistance):

The solar cell module was positioned in an ultra-energy irradiation tester, where the solar cell module was subjected to a dew cycle test of alternately repeating a cycle of conducting irradiation of ultraviolet rays having a wavelength of 300 to 400 nm at an intensity of 100 mW/cm$^2$ by means of a metal halide lamp and a cycle of conducting dew formation, for 5000 hours.

For the solar cell module thus tested, the exterior appearance thereof was optically observed. In addition, the shunt resistance of the solar cell module was measured in order to examine the presence or absence of acid corrosion at contact portions of the electrically conductive members of the cell group with the surface side covering material. The results obtained are shown in Table 1 on the basis of the following criteria.

⊚: a case where no peeling is present in the surface side covering material, no acid corrosion is present at the contact portions of the electrically conductive members of the cell group with the surface side covering material, and the initial exterior appearance is still maintained;

◯: a case where peeling is substantially not present in the surface side covering material, acid corrosion is substantially not present at the contact portions of the electrically conductive members of the cell group with the surface side covering material, and the initial exterior appearance is substantially maintained; and X: a case where distinguishable peeling is present in the surface side covering material, distinguishable acid corrosion is present at the contact portions of the electrically conductive members of the cell group with the surface side covering material, and the initial exterior appearance is apparently changed.

(4) Evaluation of the resistance to creeping:

The solar cell module was vertically positioned in an oven maintained at 100° C. and maintained for a week. The solar cell module thus treated was optically observed to see whether or not creeping or/and peeling is present in the surface side covering material. The result is shown in Table 1 on the basis of the following criteria.

◯: a case where neither peeling nor creeping are present in the surface side covering material; and X: a case where peeling and/or creeping are present in the surface side covering material.

(5) Evaluation of the resistance to scratching:

This evaluation was conducted in accordance with the manner of "scratch test" under the UL standard for examining whether or not the protection ability of a surface side covering material of a solar cell module is sufficient against external scratching. This scratch test is conducted in a manner of contacting a test instrument having a blade made of a rigid steel to the surface of solar cell module and moving it at a speed of 152.4 mm/sec. while applying a load of 907 g to the blade. Judgment of acceptance is conducted in the following manner. The solar cell module having been subjected to the scratch test is subjected to so-called Wet-Hi-Pot test (namely, high voltage dielectric breakdown test), wherein evaluation is conducted to see whether or not the solar cell module has leakage current. In the case where the solar cell module has no leakage current, the solar cell module is judged to be acceptable.

The solar cell module obtained in this example was subjected to the scratch test in the manner as above described. Then, the solar cell module was subjected to the Wet-Hi-Pot test (the high voltage dielectric breakdown test) in the following manner. The negative electrode (the negative power output terminal) and the positive electrode (the positive power output terminal) of the solar cell module were short-circuited, followed by immersing at least a part of the solar cell module in an electrolyte solution having an electric conductivity of less than 3500 ohm·cm, wherein the power output terminals were maintained without being immersed in the electrolyte solution. The electrolyte solution was rubbed in the scratched surface portion of the solar cell module caused in the scratch test for about 10 seconds. Then, the electrolyte solution was electrically connected to the negative electrode of a DC power source and the positive electrode of the DC power source was electrically connected to the short-circuited power output terminals of the solar cell module, where a DC voltage of 2000 V from the DC power source was applied between the cell group of the solar cell module and the electrolyte solution to whether a leakage current occurred.

The result is shown in Table 1 on the basis of the following criteria.

○: a case where the leakage current is apparently less than 50 µA which is satisfactory; and X: a case where the leakage current is apparently beyond 50 µA which is inferior.

EXAMPLE 2

The procedures of Example 1 were repeated, except that the step 2-(6) of Example 1, the EVA sheet was replaced by an EVA sheet obtained by subjecting the fused solid (obtained in the step 2-(3) of Example 1) to slot die extrusion without impregnating the fused solid in the nonwoven glass fiber member as in the step 2-(3), the nonwoven glass fiber member was interposed between the cell group and the EVA sheet, and the heat treatment was conducted at 195° C. for 30 minutes, thereby obtaining a plurality of solar cell modules.

Using the resultant solar cell modules, evaluation was conducted with respect to (1) exterior appearance, (2) packing performance, (3) weatherability, (4) resistance to creeping, and (5) resistance to scratching in the same manner as in Example 1.

The evaluated results are collectively shown in Table 1.

In this example, although the period of time required for the vacuum lamination treatment was longer than that in Example 1 because the non-crosslinked EVA resin material was not impregnated in the nonwoven glass fiber member, the formation of the EVA sheet as the non-crosslinked organic polymer resin 302a could be easily conducted.

EXAMPLE 3

The procedures of Example 1 were repeated, except that in the step 2-(6) of Example 1, the EVA sheet was replaced by an EVA sheet obtained Ail providing an EVA resin mixture (obtained by additionally using glass beads in the preparation of the EVA resin mixture in the step 2-(3) of Example 1), heat-fusing said EVA mixture to obtain a fused solid, and subjecting said fused solid to slot die extrusion without impregnating it in the nonwoven glass fiber member as in the step 2-(3), whereby obtaining a plurality of solar cell modules.

Using the resultant solar cell modules, evaluation was conducted with respect to (1) exterior appearance, (2) packing performance, (3) weatherability, (4) resistance to creeping, and (5) resistance to scratching in the same manner as in Example 1.

The results are collectively shown in Table 1.

In this example, the glass beads were used instead of using the nonwoven glass fiber member as in the case of Example 1. However, in this example, such significant advantages as in Example 1 are provided.

EXAMPLE 4

Figure 3B:
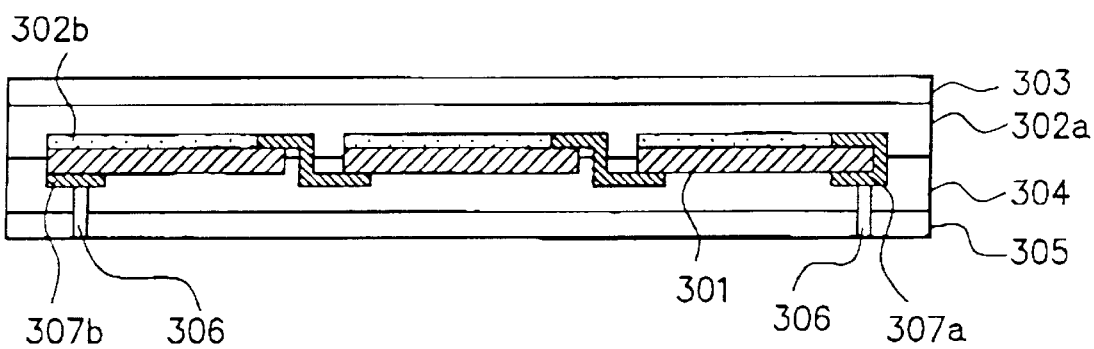

In this example, there was prepared a solar cell module having the configuration shown in FIG. 3(b).

The configuration shown in FIG. 3(b) is a partial modification of the configuration shown in FIG. 3(a), in that the crosslinked organic polymer resin 302b laminated on the corona discharged surface of the surface protective member 303 in FIG. 3(a) is changed to dispose on the light incident face (the light receiving face) of the cell group 301.

In this example, the procedures of Example 1 were repeated except for the following points, to obtain a plurality of solar cell modules.

(a). The step 2-(2) of Example 1 was not carried out. Particularly, the fused solid of the EVA resin mixture containing the crosslinking agent as the crosslinked organic polymer resin 302b was not coated on the corona discharged surface of the ETFE film as the surface protective member 303.

(b). The EVA sheet containing no crosslinking agent as the non-crosslinked organic polymer resin 302a obtained in the step 2-(3) of Example 1 was positioned to contact with the corona discharged surface of the ETFE film as the surface protective member 303 in the step 2-(6) of Example 1.

(c). An acrylic resin coating containing a crosslinking agent comprising an isocyanate as the crosslinked polymer resin 302b was coated on the light receiving face of the cell group as the photovoltaic element 301 at a thickness of 25 µm and the resultant was used as the cell group in the step 2-(6) of Example 1.

Using the resultant solar cell modules, evaluation was conducted with respect to (1) exterior appearance, (2) packing performance, (3) weatherability, (4) resistance to creeping, and (5) resistance to scratching in the same manner as in Example 1.

The evaluated results are collectively shown in Table 1.

In this example, there are such advantages as will be described in the following.

In the solar cell module obtained in this example, the surface side filler has the non-crosslinked EVA resin material contacted with the corona discharged surface of the ETFE film as the surface protective member 303 at an improved adhesion, the surface side covering material excels in weatherability (including moisture resistance). In addition, the light receiving face of the cell group as the photovoltaic element 301 is coated by the crosslinked acrylic resin coating as the crosslinked organic polymer resin 302b and because of this, the light receiving face of the cell group as the photovoltaic element 301 is prevented from being damaged particularly in the vacuum lamination treatment. In addition, the crosslinked acrylic resin material by which the light receiving face of the cell group is covered is contacted with the non-crosslinked EVA resin material at a satisfactory adhesion. Besides, since the EVA sheet comprising the non-crosslinked EVA resin material impregnated in the nonwoven glass fiber member is used for the formation of the surface side filler and the cell group previously coated by the acrylic resin coating containing the crosslinking agent is used, the vacuum lamination treatment for the production of a solar cell module can be completed for a short period of time.

EXAMPLE 5

The procedures of Example 4 were repeated, except that in the vacuum lamination treatment for the production of a solar cell module, the EVA sheet was replaced by an EVA sheet [obtained by subjecting the fused solid (obtained in the step 2-(3) of Example 1) to slot die extrusion without impregnating the fused solid in the nonwoven glass fiber member] and the nonwoven glass fiber member was interposed between said EVA sheet and the cell group whose light receiving face being covered by the coat layer comprising the acrylic resin coating containing the crosslinking agent (comprising the isocyanate), whereby obtaining a plurality of solar cell modules.

Using the resultant solar cell modules, evaluation was conducted with respect to (1) exterior appearance, (2) packing performance, (3) weatherability, (4) resistance to creeping, and (5) resistance to scratching in the same manner as in Example 1.

The evaluated results are collectively shown in Table 1.

In this example, although the period of time required for the vacuum lamination treatment was longer than that in Example 4 because the non-crosslinked EVA resin material was not impregnated in the nonwoven glass fiber member, the formation of the EVA sheet as the non-crosslinked organic polymer resin 302a could be easily conducted.

Comparative Example 1

In this comparative example, the procedures of Example 1 were repeated except for the following points, to obtain a plurality of solar cell modules.

(a). The step 2-(2) of Example 1 was not carried out. Particularly, the fused solid of the EVA resin mixture containing the crosslinking agent as the crosslinked organic polymer resin 302b was not coated on the corona discharged surface of the ETFE film as the surface protective member 303.

(b). The EVA sheet containing no crosslinking agent as the non-crosslinked organic polymer resin 302a was replaced by an EVA sheet obtained by providing a EVA resin mixture comprising 100 parts by weight of an EVA resin (having a vinyl acetate content of 33%), 3 parts by weight of 2,5-dimethyl-2,5-bis(t-butylperoxy)hexane as a crosslinking agent, 0.3 part by weight of γ-methacryloxypropyltrimethoxysilane as a silane coupling agent, 0.1 part by weight of bis(2,2,6,6-tetramethyl-4-piperidyl)sebacate as a photo-stabilizer, and 0.2 part by weight of tris(mono-nonylphenyl)phosphate as an antioxidant, heat-fusing the EVA resin mixture to obtain a fused solid, and subjecting the fused solid to slot die extrusion. The EVA sheet herein contains the crosslinking agent.

(c). In the vacuum lamination treatment in the step 2-(6) of Example 1, on the light receiving face of the cell group, there were laminated a nonwoven glass fiber member, the EVA sheet containing the crosslinking agent obtained in the above (b) and the ETFE film having the corona discharged surface as the surface protective member in this order.

Using the resultant solar cell modules, evaluation was conducted with respect to (1) exterior appearance, (2) packing performance, (3) weatherability, (4) resistance to creeping, and (5) resistance to scratching in the same manner as in Example 1.

The results are collectively shown in Table 1.

Comparative Example 2

The procedures of Comparative Example 1 were repeated, except that the EVA sheet containing the crosslinking agent was replaced by an EVA sheet containing no crosslinking agent obtained in the same manner as in the (b) of Comparative Example 1 except for omitting the crosslinking agent contained in the EVA resin mixture, to obtain a plurality of solar cell modules.

Using the resultant solar cell modules, evaluation was conducted with respect to (1) exterior appearance, (2) packing performance, (3) weatherability, (4) resistance to creeping, and (5) resistance to scratching in the same manner as in Example 1.

The evaluated results are collectively shown in Table 1.

Comparative Example 3

The procedures of Comparative Example 1 were repeated, except that the heat treatment of the stacked body in the vacuum lamination treatment was conducted at 160° C. for 50 minutes, to obtain a plurality of solar cell modules.

Using the resultant solar cell modules, evaluation was conducted with respect to (1) exterior appearance, (2) packing performance, (3) weatherability, (4) resistance to creeping, and (5) resistance to scratching in the same manner as in Example 1.

The results are collectively shown in Table 1.

TABLE 1

|  | lamination temperature (° C.) | lamination time (minutes) | exterior appearance | packing performance of the surface side covering material* | weatherability (including moisture resistance) | resistance to creeping | resistance to scratching |
| --- | --- | --- | --- | --- | --- | --- | --- |
| Example 1 | 195 | 15 | ○ | ○ | ⊚ | ○ | ○ |
| Example 2 | 195 | 30 | ○ | ○ | ○ | ○ | ○ |
| Example 3 | 195 | 15 | ○ | ○ | ⊚ | ○ | ○ |
| Example 4 | 195 | 16 | ○ | ○ | ⊚ | ○ | ○ |
| Example 5 | 195 | 30 | ○ | ○ | ○ | ○ | ○ |
| Comparative Example 1 | 195 | 15 | x | x | x | ○ | ○ |
| Comparative Example 2 | 195 | 15 | ○ | ○ | x | x | x |
| Comparative Example 3 | 160 | 50 | ○ | ○ | x | ○ | ○ |

*in the series connection portions of the cell group

As Table 1 illustrates, it is understood that any of the solar cell modules obtained in Examples 1 to 5 belonging to the present invention in which the surface side filler comprises the non-crosslinked organic polymer resin and the crosslinked organic polymer resin wherein the crosslinked organic polymer resin is arranged on at least a face of the non-crosslinked organic polymer resin is satisfactory not only in weatherability (including moisture resistance) but also in exterior appearance, packing performance, resistance to creeping, and resistance to scratching. Especially for the solar cell modules obtained in Examples 1, 3 and 4, it is understood that they remarkably excel in weatherability (including moisture resistance).

And in the case of each of Examples 1, 3 and 4 in which the non-crosslinked EVA resin material previously impregnated in the nonwoven glass fiber member was used (see, Examples 1 and 4) or the non-crosslinked EVA resin material incorporated with the glass beads without using the nonwoven glass fiber member (see, Example 3), it is understood that the period of time required for the vacuum lamination treatment for the production of a solar cell module is desirably short.

It should be understood that the scope of the present invention is not restricted to Examples 1 to 5 and any of the embodiments described in these examples can be properly modified within a range of not changing the gist of the present invention.

Now, as previously described, according to the present invention, there are provided such significant advantages as will be described below.

Because the non-crosslinked organic polymer resin containing no crosslinking agent is used in the surface side filler, such adverse effect due to the crosslinking agent as found in the prior art can be desirably prevented from occurring and as a result, a surface side covering material excelling in weatherability can be attained. This situation makes it possible to attain a highly reliable solar cell module have excellent weatherability (including moisture resistance).

Because the crosslinked organic polymer resin is arranged between the surface protective member and the non-crosslinked organic polymer resin or/and between the photovoltaic element and the non-crosslinked organic polymer resin, the adhesion of the non-crosslinked organic polymer resin as a principal constituent of the surface side filler with the surface protective member or/and the photovoltaic element is remarkably ensured.

When either the crosslinked organic polymer resin or the non-crosslinked organic polymer resin, which are used as the surface side filler, is impregnated in a glass fiber prior to using them, defects of resin-impregnation in the glass fiber do not substantially occurred upon subjecting these resins to vacuum lamination treatment for the production of a solar cell module, where such residual bubbles due to the volatilization of the crosslinking agent as found in the prior art is not afforded. This situation makes it possible to attain a highly reliable solar cell module having a good exterior appearance.

For the surface side filler comprising a layer of the crosslinked organic polymer resin and a layer of the non-crosslinked organic polymer resin, one of these layers has no glass fiber. Because of this, moisture invasion is desirably prevented and therefore, problems due to acetic acid liberation as found in the prior art are prevented, where the photovoltaic element is desirably prevented from suffering from moisture invasion. This situation makes it possible to attain a highly reliable solar cell module have excellent moisture resistance.

Even in the case of using a photovoltaic element (or a solar cell) whose short-circuited defects (or shunted defects) have been repaired by means of passivation treatment, one can attain a highly reliable solar cell module having a surface side covering material excelling in moisture resistance in which the photovoltaic characteristics of the repaired photovoltaic element are desirably prevented from being deteriorated due to moisture invasion.

What is claimed is:

1. A solar cell module comprising a photovoltaic element, and at least a surface side filler and a surface protective member which are disposed in this order on a light incident face of said photovoltaic element, characterized in that said surface side filler comprises a non-crosslinked organic polymer resin and a crosslinked organic polymer resin, wherein said crosslinked organic polymer resin is provided on at least a surface of said non-crosslinked organic polymer resin, and the organic polymer resin of each of said crosslinked organic polymer resin and said non-crosslinked organic polymer resin comprises at least an organic polymer resin selected from the group consisting of ethylene-vinyl acetate copolymer, polyvinyl butyral, epoxy resins, acrylic resins, silicone resins, and fluororesins.

2. A solar cell module according to claim 1, wherein the crosslinked organic polymer resin comprises said organic polymer resin which is crosslinked by an organic peroxide.

3. A solar cell module according to claim 1, wherein at least either the non-crosslinked organic polymer resin or the crosslinked organic polymer resin is impregnated in a glass fiber.

4. A solar cell module according to claim 1, wherein the crosslinked organic polymer resin has a gel fraction of 60% or more, and the non-crosslinked organic polymer resin has a gel fraction of 10% or less.

5. A solar cell module according to claim 1, wherein the surface protective member has a corona discharged surface contacted with the surface side filler.

6. A process for producing a solar cell module, comprising steps of:
(a) laminating at least an organic polymer resin sheet containing no crosslinking agent and a surface protective member in this order on a light incident face of a photovoltaic element to obtain a stacked body, said organic polymer resin sheet comprising at least an organic polymer resin selected from the group consisting of ethylene-vinyl acetate copolymer, polyvinyl butyral, epoxy resins, acrylic resins, silicone resins, and fluororesins;
(b) subjecting said stacked body to thermocompression bonding treatment:
wherein said step (a) includes a step of forming a layer comprising a crosslinked organic polymer resin on the surface of said surface protective member to be contacted with said organic polymer resin sheet, the organic polymer resin of said crosslinked organic polymer resin comprising at least an organic polymer resin selected from the group consisting of ethylene-vinyl acetate copolymer, polyvinyl butyral, epoxy resins, acrylic resins, silicone resins, and fluororesins.

7. The process according to claim 6, wherein the organic polymer resin sheet containing no crosslinking agent is formed by impregnating the organic polymer resin containing no crosslinking agent in a glass fiber, said organic polymer resin comprising an organic polymer resin selected from the group consisting of ethylene-vinyl acetate copolymer, polyvinyl butyral, epoxy resins, acrylic resins, silicone resins, and fluororesins.

8. A process for producing a solar cell module, comprising the steps of:
(a) forming a layer comprising a crosslinked organic polymer resin on a light incident face of a photovoltaic element, the organic polymer resin of said crosslinked organic polymer resin comprising at least an organic polymer resin selected from a group consisting of ethylene-vinyl acetate copolymer, polyvinyl butyral, epoxy resins, acrylic resins, silicone resins, and fluororesins;
(b) laminating an organic polymer resin sheet containing no crosslinking agent and a surface protective member in this order on said layer formed on said light incident face of said photovoltaic element to obtain a stacked body, said organic polymer resin sheet comprising at least an organic polymer resin selected from a group consisting of ethylene-vinyl acetate copolymer, polyvinyl butyral, epoxy resins, acrylic resins, silicone resins, and fluororesins; and (c) subjecting said stacked body to thermocompression bonding treatment.

9. The process according to claim 8, wherein the organic polymer resin sheet containing no crosslinking agent is formed by impregnating an organic polymer resin containing no crosslinking agent in a glass fiber, said organic polymer resin comprising an organic polymer resin selected from a group consisting of ethylene-vinyl acetate copolymer, polyvinyl butyral, epoxy resins, acrylic resins, silicone resins, and fluororesins.

10. A building construction material comprising a photovoltaic element which is sealed by a surface side filler to cover a light incident face of said photovoltaic element and a backside filler to cover a back face of said photovoltaic element on a back face reinforcing member, and a surface protective member provided to cover said surface side filler, wherein said surface side filler comprises a non-crosslinked organic polymer resin which is arranged on at least a surface of a crosslinked organic polymer resin, and the organic polymer resin of each of said non-crosslinked organic polymer resin and said crosslinked organic polymer resin comprises at least an organic polymer resin selected from the group consisting of ethylene-vinyl acetate copolymer, polyvinyl butyral, epoxy resins, acrylic resins, silicone resins, and fluororesins.

11. A sunlight power generation apparatus comprising a solar cell module and a power conversion device electrically connected to said solar cell module, wherein said solar cell module comprises a photovoltaic element, and at least a surface side filler and a surface protective member which are disposed in this order on a light incident face of said photovoltaic element, said surface side filler comprising a non-crosslinked organic polymer resin and a crosslinked organic polymer resin, said crosslinked organic polymer resin being provided on at least a surface of said non-crosslinked organic polymer resin, and the organic polymer resin of each of said non-crosslinked organic polymer resin and said crosslinked organic polymer resin comprises at least an organic polymer resin selected from a group consisting of ethylene-vinyl acetate copolymer, polyvinyl butyral, epoxy resins, acrylic resins, silicone resins, and fluororesins.

* * * * *

UNITED STATES PATENT AND TRADEMARK OFFICE
CERTIFICATE OF CORRECTION

PATENT NO. : 6,204,443 B1
DATED : March 20, 2001
INVENTOR(S) : Sigeo Kiso et al.

It is certified that error appears in the above-identified patent and that said Letters Patent is hereby corrected as shown below:

Drawings,
Sheet 3, FIG. 3a, "302c" should read -- 302a --.

Column 2,
Line 16, "such" should read -- such a --.

Column 3,
Line 10, "the" (first occurrence) should be deleted;
Line 15, "facilitating to shunt" should read -- facilitating the shunting of --.

Column 4,
Line 19, "desirably" should read -- desirably sealed --;
Line 22, "under" should read -- under a --.

Column 5,
Line 26, "have" should read -- having --.

Column 6,
Line 7, "To crosslink" should read -- Crosslinking of --.

Column 10,
Line 13, "($In_2O_3$-SnO2)," should read -- ($In_2O_3$-$SnO_2$), --;
Line 25, "until" should be deleted;
Line 30, "is" and "in a state" should be deleted and "having" should read -- has --.

Column 11,
Line 6, "206bserve" should read -- 206b serve --;
Line 52, "(FVdF)," should read -- (PVdF), --;
Line 55, "FvdF" should read -- PVdF --.

Column 12,
Line 46, "to" should read -- for --.

Column 14,
Line 8, "That is" should be deleted and "there" should read -- There --;
Line 19, "a" should read -- A --;
Line 59, "An" should read -- A --.

UNITED STATES PATENT AND TRADEMARK OFFICE
CERTIFICATE OF CORRECTION

PATENT NO. : 6,204,443 B1
DATED : March 20, 2001
INVENTOR(S) : Sigeo Kiso et al.

It is certified that error appears in the above-identified patent and that said Letters Patent is hereby corrected as shown below:

Column 16,
Line 9, "302B" should read -- 302b --;
Line 41, "ETE" should read -- ETFE --.

Column 17,
Line 21, "Pressure)" should read -- pressure) --;
Line 23, "an" should read -- in --;
Line 31, "bubble" should read -- bubbles --;
Line 33, "bubble" should read -- bubbles --.

Column 18,
Line 64, "to" should read -- to examine --.

Column 19,
Line 7, "that" should read -- that in --;
Line 40, "whereby" should read -- thereby --.

Column 20,
Line 29, "adhesion," should read -- adhesion, and --;
Line 41, "Besides," should read -- Further, --;
Line 47, "for" should read -- in --;
Line 61, "whereby" should read -- thereby --.

Column 22,
Line 65, "(see," should read -- (see --.

Column 23,
Line 15, "effect" should read -- effects --;
Line 33, "occurred" should read -- occur --;
Line 49, "have" should read -- having --.

UNITED STATES PATENT AND TRADEMARK OFFICE
CERTIFICATE OF CORRECTION

PATENT NO.   : 6,204,443 B1
DATED        : March 20, 2001
INVENTOR(S)  : Sigeo Kiso et al.

It is certified that error appears in the above-identified patent and that said Letters Patent is hereby corrected as shown below:

Column 24,
Line 21, "steps" should read -- the steps --;
Line 32, "treatment:" should read -- treatment; --;

Signed and Sealed this

Eleventh Day of February, 2003

JAMES E. ROGAN
*Director of the United States Patent and Trademark Office*